United States Patent [19]

Beckenbaugh et al.

[11] 4,304,849

[45] Dec. 8, 1981

[54] METHODS OF DEPOSITING METALLIC COPPER ON SUBSTRATES

[75] Inventors: William M. Beckenbaugh, East Anwell Township, Hunterdon County; Theodore D. Polakowski, Jr., Bergenfield; Donald Dinella, Berkley Heights, all of N.J.; Patricia J. Goldman, Naugatuck, Conn.

[73] Assignee: Western Electric Co., Inc., New York, N.Y.

[21] Appl. No.: 150,546

[22] Filed: May 16, 1980

[51] Int. Cl.$^3$ .............................................. B05D 3/06
[52] U.S. Cl. ................... 430/417; 427/54.1; 427/92; 427/98; 427/443.1
[58] Field of Search .............. 430/417; 427/54.1, 92, 427/98, 430 A

[56] References Cited

U.S. PATENT DOCUMENTS

Re. 29,015 10/1976 DeAngelo et al. .
3,492,135 1/1970 Clauss .
3,697,319 10/1972 Feldstein .
3,758,332 9/1973 Dinella et al. .
3,925,578 12/1975 Polichette et al. .
3,949,121 4/1976 Kenney .
4,098,922 7/1978 Dinella et al. ................. 427/54.1

Primary Examiner—John H. Newsome
Attorney, Agent, or Firm—J. J. Jordan

[57] ABSTRACT

In an improved method for depositing a metal on a substrate of the type in which a dielectric coated substrate is coated with a sensitizing solution containing a reductible metal salt, a primary reducing agent comprising 2,7 anthraquinone disulfonic acid and a secondary reducing agent, the substrate is exposed to ultraviolet light in an atmosphere having a temperature of at least 117° F. (42° C.) and a mass of water vapor of at least 3.8 mg of water per liter of dry air for at least 15 seconds. In an embodiment of the method the substrate is aerated in a moisture controlled atmosphere at room temperature for at least 30 minutes prior to exposing the substrate to ultraviolet light.

5 Claims, 4 Drawing Figures

METHODS OF DEPOSITING METALLIC COPPER ON SUBSTRATES

TECHNICAL FIELD

This application relates generally to methods of depositing metallic copper on a substrate, and particularly to improved methods of the type described U.S. Pat. No. 4,268,536 to W. M. Beckenbaugh, P. J. Goldman and T. D. Polakowski issued on May 19, 1981 and entitled "Method for Depositing a Metal on a Surface", herein incorporated by reference.

BACKGROUND OF THE INVENTION

As described in the above mentioned patent, copper is deposited at selected locations on a substrate, such as an epoxy-coated metal printed circuit "board," by coating the substrate with a sensitizer layer containing a reducible copper salt, such as copper formate, and exposing the layer to ultraviolet radiation through a mask so as to form a seed pattern of metallic copper at the exposed areas, which later acts as a deposition site for conventional electroless plating of copper on the seed pattern, for example in a process of making printed circuits.

The seed pattern comprises $copper^I$ or $copper^O$ converted from the $copper^{II}$ in the copper salt and it is desirable to be able to control the available $copper^{II}$ converted to the catalytic specie ($copper^I$ or $copper^O$) during exposure to the ultraviolet radiation in order to aid deposition during the electroless plating.

In a preferred example, as described in the copending patent the sensitizer layer comprises a dried film including as principal constituents:

(a) copper formate, as the reductible copper salt;

(b) disodium 2,7 anthraquinone disulfonate, which acts as a primary reducing agent for the reaction; and (c) sorbitol, which acts as a secondary reducing agent for the reaction and releases absorbed moisture.

As described in the copending patent, such compositions particularly those including 2,7 anthraquinone disulfonic acid or salts thereof are particularly effective in producing copper seed coating and are especially advantageous in providing a relatively long shelf life for the dried sensitizer film, such as seven days allowable time lapse between formation of the dried sensitizer film and the exposing step.

SUMMARY OF THE INVENTION

In accordance with the principles of this invention, a dried sensitizer film including a copper salt such as copper formate, disodium 2,7 anthraquinone disulfonate, and a polyol such as sorbitol is exposed to ultraviolet radiation at a temperature of 117° F.–250° F. (42° C.–121° C.) in an atmosphere containing 3.8–10.8 milligrams (mg) of water vapor per liter of dry air for a time and at a dosage rate sufficient to deposit photoreduced copper at the exposed areas of the film. Preferably, the peak radiation dosage is 400–700 milliwatts per $cm^2$ and the exposure time is 15–60 seconds.

In a specific embodiment of the invention the substrates are aerated in a moisture controlled atmosphere for at least 30 minutes prior to exposure to the ultraviolet light.

Within these exposure parameters, it has been found the $copper^{II}$ conversion to $copper^I$ or $copper^O$ is maximized; that is, approximately 75% to 85% of the $copper^{II}$ is converted to catalytic specie. This results in a sharp, dark pattern being imaged on the substrate which permits a maximization of the electroless metal deposition during the subsequent manufacturing step.

Other objects, specific advantages, and features of the invention will be apparent from the following detailed description of specific examples and embodiments thereof, when read in conjunction with the accompanying drawings.

DETAILED DESCRIPTION

Figure 1:
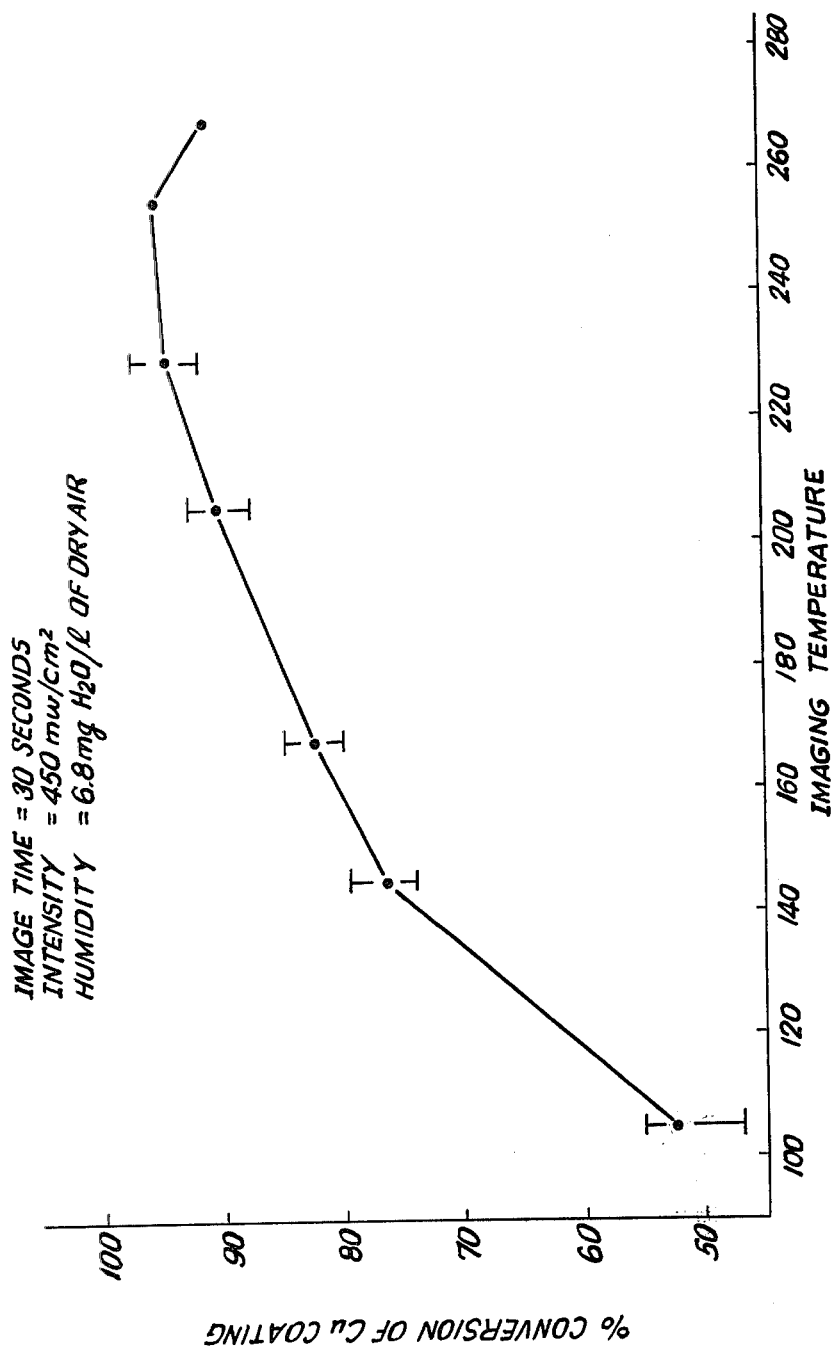
FIG. 1 is a graph showing the relationship between the percent conversion of copper coating and imaging temperature of the part.
Figure 2:
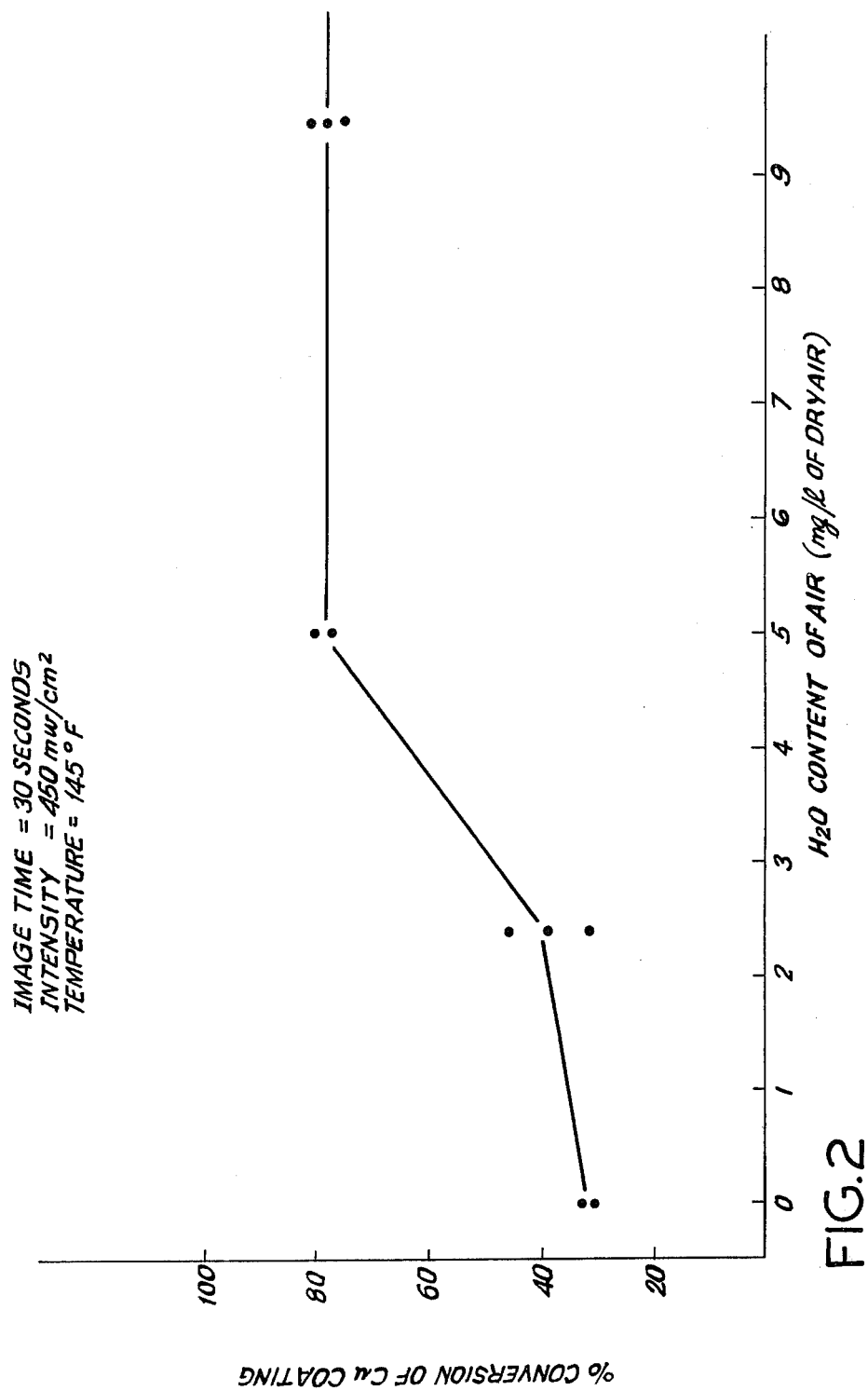
FIG. 2 is a graph showing the relationship between the percent conversion of copper coating and the water content of air.
Figure 3:
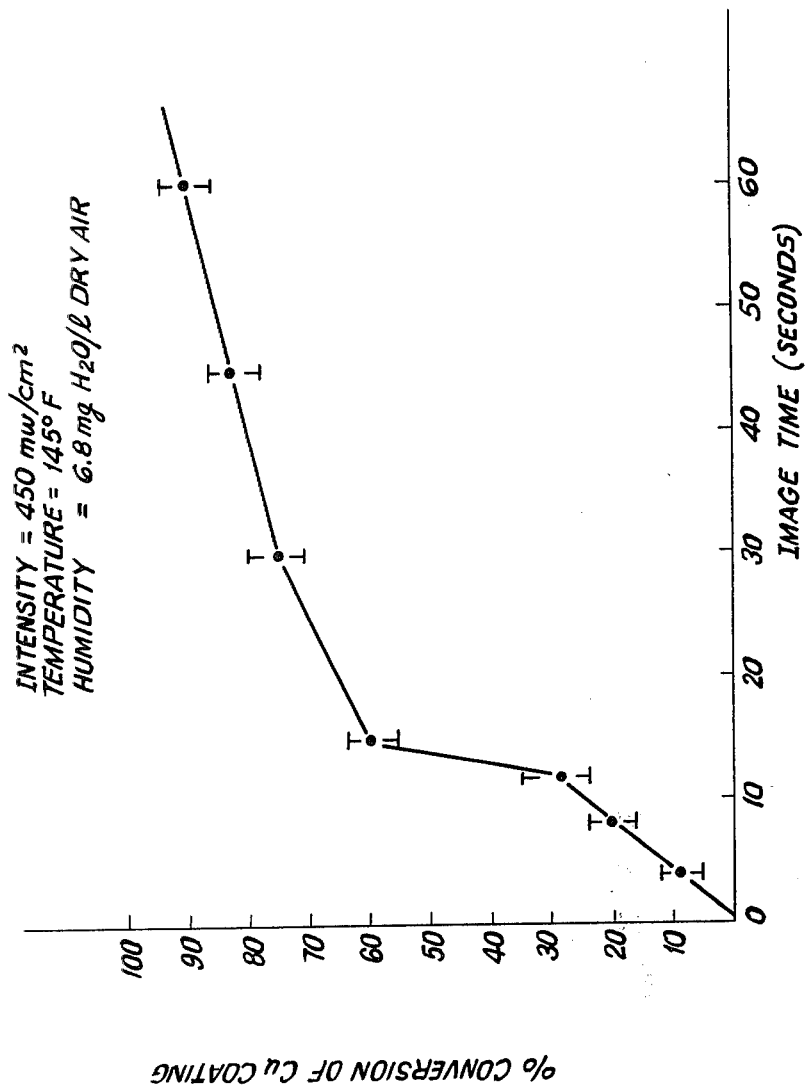
FIG. 3 is a graph showing the relationship between the percent conversion of copper coating and imaging time.
Figure 4:
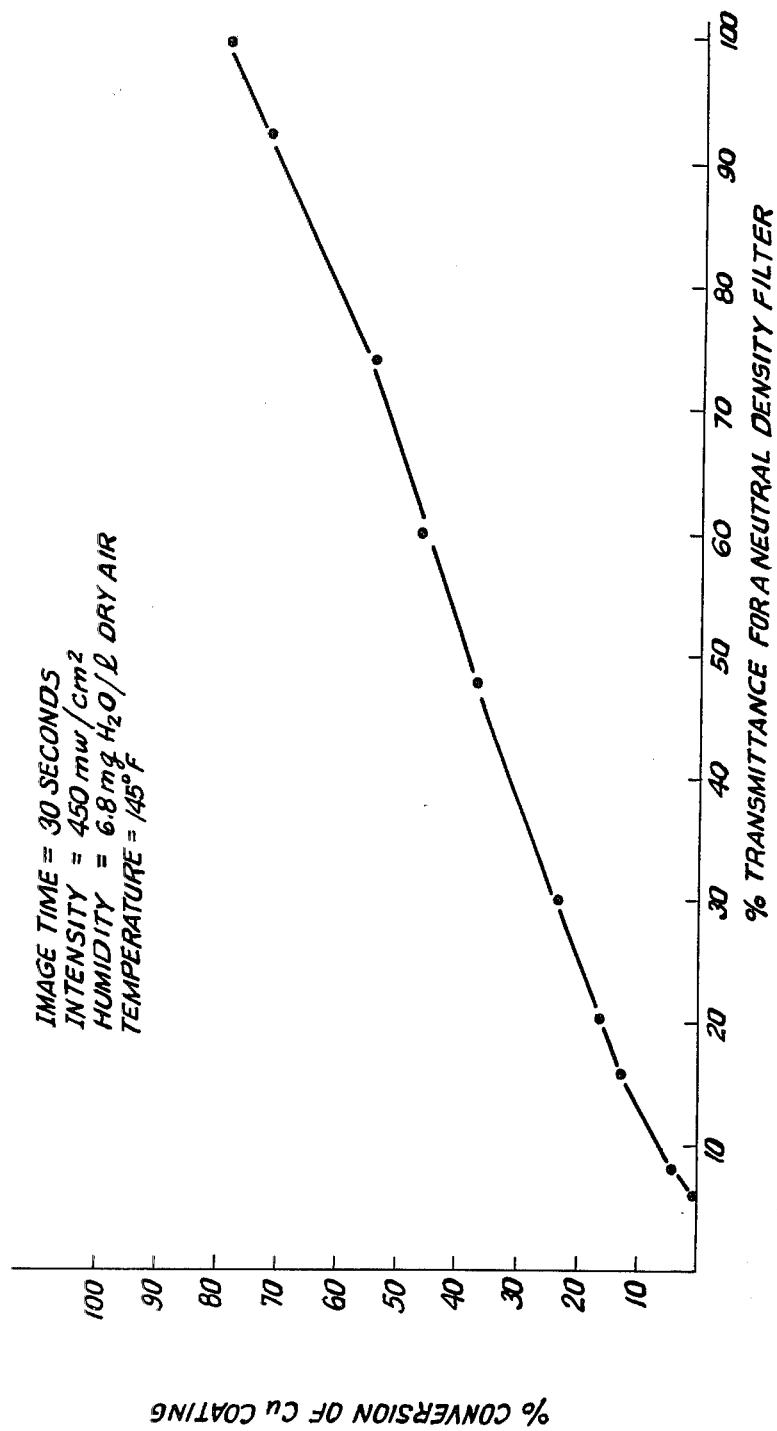
FIG. 4 is a graph showing the relationship between the percent conversion of copper coating and the percent transmittance of a neutral density filter over an ultraviolet light.

In accordance with one specific embodiment and example of the invention, a sensitizer solution is made up consisting of an aqueous solution of the following ingredients:

| | |
|---|---|
| (a) copper formate | 26 grams/liter |
| (b) disodium 2,7 anthraquinone disulfonate | 16 grams/liter |
| (c) sorbitol | 100 grams/liter |
| (d) butanol | 50 grams/liter |

An epoxy coated steel printed circuit substrate is coated with the sensitizer solution by dipping the substrates in a tank of the solution at room temperature for a time of 90 seconds and then withdrawing the substrate from the tank. Preferably, the withdrawing substrates are passed between pairs of synthetic chamois covered compression rollers as described in U.S. Pat. No. 4,269,138 to D. Dinella, A. H. Haller and T. D. Polakowski entitled "Apparatus for Distributing Liquid Over a Surface," issued on May 26, 1981, herein incorporated by reference. As described in that patent, the compression rollers serve to apply a uniform, controllable thickness film of the sensitizer liquid to the planar surfaces of the substrate.

After dipping, the sensitizer liquid coating is dried in an oven at a temperature of 190° F. to 210° F. (89° C. to 99° C.) for a time of 2.5 to 3.5 minutes to form a dried film of the sensitizer on the substrate. As described in the above mentioned U.S. Pat. No. 4,268,536, the coated board may now be stored in this form for a substantial period of time, several days if desired, prior to the exposing operation.

Subsequently, the substrate with the dried film is exposed to ultraviolet radiation through a mask, such as a glass photo tool with an image photographically placed on one side, to form seed deposits or nuclei of metallic copper at the irradiated sites on the surfaces of the substrate.

In accordance with one specific example of the invention, the sensitizer coated substrate is exposed to, or aerated in, an atmosphere having a temperature of 60°

F. to 75° F. (16° C. to 24° C.) and a mass of water vapor between 2.6 and 10.5 milligrams (mg) per liter of dry air for a period of at least 30 minutes prior to being exposed to ultraviolet light. Preferably, to achieve optimum imaging on the substrate, the temperature should be held to 68° F. (20° C.), considered room temperature, and the mass of water vapor at 5.3 milligrams (mg)/liter. The substrate is aerated to permit the sensitizer coating to equilibrate to ambient conditions and thus accept water vapor from the surrounding air by using the constituent sorbitol as the vehicle for absorbing the required water. By aerating the substrate for 30 minutes in an atmosphere having the above mentioned moisture content, a known amount of water is absorbed thus assuring the sufficient catalytic reduction will occur on the substrate.

During this aerating step additional water vapor, if required, must be added as a vapor to the ambient atmosphere and not as a spray on the substrate, since a spray will dilute and wash the water soluble sensitizer coating off the substrate.

The substrate is next exposed to ultraviolet light radiation in an atmosphere containing 3.8 to 10.8 milligrams of water vapor per liter of dry air at a temperature of 108° F. to 250° F. (42° C. to 121° C.) for a period of 15 to 60 seconds. Preferably, the temperature is 145° F. (63° C.) and the exposure time 30 seconds.

The ultraviolet radiation is provided by a medium pressure mercury lamp at a power of 360 to 700 milliwatts/cm$^2$ having a wavelength of 4000 angstroms or less with an irradiance of at least 5300 milli joules/cm$^2$. A typical medium pressure mercury lamp for use herein is manufactured by HANOVIA INC. of Newark, N.J. and is coded 6S2S-A-431.

After the formation of the copper seed patterns, the background sensitizer film is dissolved as by a chemical reaction, as described in the above mentioned U.S. Pat. No. 4,268,536, to leave the board with the seed patterns of deposited copper at the exposed regions, and copper printed circuit conductors are then electrolessly deposited on the seed patterns in any conventional fashion, such as disclosed in the Beckenbaugh and Morton U.S. Pat. No. 4,167,601.

SELECTION OF PROCESS PARAMETERS

In the practice of such copper deposition processes from reducible copper-salts containing sensitizer films, it has been discovered that the conversion rate of the copper available from the desired sensitizer to copper specie imaged during patterning changes with variations in each of four following criteria:

(1) Ambient temperature;
(2) Water content of ambient atmosphere;
(3) Imaging time; and
(4) Light intensity experienced during imaging To determine the effect that each of the four variable criteria has on the conversion rate of the available copper, tests were performed during imaging, wherein three of the four variables were held constant while the fourth was varied, and the conversion rates were measured. The tests were repeated for each of the four variables; that is each was varied while the remaining three were held constant. The results of these tests are shown in the four graphs discussed below, FIGS. 1-4.

The tests were conducted in a chamber having an ultraviolet light for imaging the desired pattern. The chamber was sufficiently large to accommodate substrates, while permitting controlled variations in ambient temperature and water content of the atmosphere contained in the chamber.

FIG. 1

Substrates comprising a steel core with a fully cured diglycerol ether of bisphenol A epoxy coating thereon were selected. The substrates were immersed in a solvent bath comprising methyl ethyl ketone for 10 minutes at 77° F. (25° C.). The substrates were then water rinsed for 1 minute at 77° F. (25° C.) and then etched in an aqueous solution comprising 360 grams of $CRO_3$, 250 grams of $H_3PO_4$ and 180 grams of $H_2SO_4$ in 1,000 millimeters of water, maintained at 77° F. (25° C.) for 10 minutes. The etched substrates were then water rinsed at 77° F. (25° C.) for 10 minutes. The above is hereinafter referred to as the pretreatment step.

A sensitizing solution was prepared by dissolving 21 grams of cupric formate, 16 grams of the disodium salt of 2,7 anthraquinone disulfonic acid, 100 grams of sorbitol, 50 grams butanol in 1,000 milliliters of water. The etched substrates were immersed in the sensitizing solution for 90 seconds at room temperature, withdrawn therefrom by passing the substrates between synthetic chamois rollers, and dried at 190° F. to 210° F. (89° C. to 99° C.) for 2.5 to 3.5 minutes. The amount of copper present was determined by X-ray fluorescence. The substrates were then stored for 3 days. After storage, a surface of the dried substrate was placed in a chamber and selectively exposed, through an imaging mask, to a high pressure mercury xenon discharge lamp with a light intensity of 450 mw/cm$^2$, in an atmosphere containing 6.8 mg of water/pound of dry air for 30 seconds to form a real image. The exposed surface was rinsed in an alkaline cleaning solution comprising formaldehyde, potassium ferricyanide, sodium hydroxide and EDTA followed by a rinse in deionized water for 1 minute. Subsequent to the deionized water rinse, the surface was dipped in an acetic acid solution which hardens and fixes the image and further removes any uncatalyzed copper still remaining on the surface. Prior to electroless plating, another rinse in deionized water was used, and the amount of imaged copper was determined by X-ray fluorescence techniques. Finally, the imaged substrate was immersed in an electroless metal deposition solution comprising cupric sulphate, formaldehyde, potassium ferrocyanide, sodium hydroxide, EDTA, mercuric acetate and phenol mercuric acetate. A 0.08 mil (0.20 mm) thick electroless copper pattern corresponding to the real image was generally deposited in 15 minutes on substrates having at least a 60% conversion of copper specie to catalytic copper, which is equivalent to at least about 2 gm/cm$^2$ of catalytic copper on the substrate surface. If the copper level declines below the minimum, no electroless plating or discontinuous plating results. As seen in FIG. 1, when the imaging temperature is less than 117° F. (42° C.), the % conversion of copper coating is below 60% and, therefore, is unacceptable.

FIG. 2

The procedure set forth in FIG. 1 was repeated except that water content of the atmosphere in the chamber was varied while substrates were exposed for 30 seconds to a light intensity of 450 mw/cm$^2$ at an ambient temperature of 145° F. (63° C.).

The percent conversion of copper is over 60% (acceptable) when the water content is 3.8 mg/liter of dry air in the chamber. It is seen that the best results occur, 80% conversion, when the water content is greater than 5 mg/liter.

FIG. 3

The procedure set forth in FIG. 1 was again repeated, except that the imaging time, or exposure time, was varied while substrates were exposed to ultraviolet light with an intensity of 450 mw/cm. an ambient temperature of 145° F. (63° C.) and the surrounding atmosphere contained 6.8 mg of water/liter of dry air.

The 60% rate of conversion (acceptable) was reached when the imaging time is 15 seconds or more and is greater than 75% (maximum) for imaging times between 25 and 60 seconds.

FIG. 4

The procedure set forth in FIG. 1 was repeated except that an adjustable neutral density filter was inserted in the ultraviolet light. A neutral density filter can be used to vary the amount of light impinging upon a surface without selectively filtering any particular light wavelength. The ultraviolet light was operated at an intensity of 450 mw/cm$^2$ with the adjustable filter, and the substrates were imaged for 30 seconds at an ambient temperature of 145° F. in an atmosphere containing 6.8 mg of water per liter of dry air.

Less than 60% (acceptable) conversion rates were effected when the filter was set at 80% transmittance; that is, the light intensity was 360 mw/cm$^2$ (450×0.80). It is seen that at 100% transmittance, 450 mw/cm$^2$, the % conversion of copper coating is 80%.

It is thus seen that when substrates are exposed under ultraviolet radiation of approximately 450 milliwatts/cm$^2$ at an ambient temperature of 145° F. (63° C.) in an ambient atmosphere containing 5 mg of water vapor per liter of dry air for at least 25 seconds that a sharp dark pattern will be imaged on the substrate.

While various specific examples and embodiments of the invention have been described in detail hereinabove, it should be obvious that various modifications may be made from the specific details, steps and materials described, without departing from the spirit and scope of the invention.

What is claimed:

1. An improved method for depositing a metal on a substrate of the type in which a dielectric coated substrate is coated with a sensitizing solution containing a reductible metal salt, a primary reducing agent comprising 2, 7 anthraquinone disulfonic acid or an alkali metal salt thereof, and a secondary reducing agent, and in which the coated substrate is dried and thereafter exposed to ultraviolet radiation to form catalytic metal sites at regions where metal is to be deposited, wherein the improvement comprises:

during the exposing step exposing the substrate to ultraviolet light having an intensity of at least 360 mw/cm$^2$ for not less than 15 seconds in an atmosphere having a temperature between 117° F. (47° C.) and 260° F. (127° C.) and a mass of water vapor of at least 3.8 mg of water per liter of dry air.

2. The improved method as recited in claim 1, wherein the secondary reducing agent is selected from a group of polyols consisting of sorbitol and a mixture of sorbitol and lactose.

3. The improved method as recited in any of the preceding claims wherein, prior to the exposing step, the substrate is aerated in an atmosphere having a temperature of at least 60° F. and containing at least 2.6 milligrams of water per liter of dry air for at least 30 minutes.

4. An improved method for depositing a metal on a substrate, of the type in which a dielectric coated substrate is coated with a sensitizing solution containing a reducible metal salt of a non-noble metal, a primary reducing agent selected from the group consisting of 2,7 anthraquinone disulfonic acid, alkali metal salts of 2,7 anthraquinone disulfonic acid, and mixtures thereof, and a second reducing agent, and in which the coated substrate is dried and thereafter exposed to ultraviolet radiation to form catalytic metal sites at regions where metal is to be deposited, wherein the improvement comprises:

performing the exposing step for at least 25 seconds in an atmosphere having at least 5.0 mg of water per liter of dry air and a temperature of at least 145° F. (63° C.), and wherein the intensity of the ultraviolet radiation is at least 450 mw/cm$^2$.

5. The improved method as recited in claim 4, wherein prior to the exposing step, the coated substrate is aerated in an atmosphere having a mass of water vapor of not less than 5.3 mg per liter of dry air at room temperature for at least 30 minutes.

* * * * *